(12) United States Patent
Schlemper et al.

(10) Patent No.: US 10,854,775 B2
(45) Date of Patent: Dec. 1, 2020

(54) METHOD AND DEVICE FOR TRANSFERRING ELECTRONIC COMPONENTS BETWEEN SUBSTRATES

(71) Applicant: MÜHLBAUER GMBH & CO. KG, Roding (DE)

(72) Inventors: Klaus Schlemper, Dresden (DE); Hans-Peter Monser, Dresden (DE); Sigmund Niklas, Zell (DE)

(73) Assignee: MÜHLBAUER GMBH & CO. KG, Roding (DE)

(*) Notice: Subject to any disclaimer, the term of this patent is extended or adjusted under 35 U.S.C. 154(b) by 0 days.

(21) Appl. No.: 16/347,435

(22) PCT Filed: Sep. 26, 2017

(86) PCT No.: PCT/EP2017/074336
§ 371 (c)(1),
(2) Date: May 3, 2019

(87) PCT Pub. No.: WO2018/082845
PCT Pub. Date: May 11, 2018

(65) Prior Publication Data
US 2019/0334056 A1 Oct. 31, 2019

(30) Foreign Application Priority Data
Nov. 3, 2016 (DE) .................. 10 2016 221 533

(51) Int. Cl.
*H01L 33/00* (2010.01)
*H01L 21/68* (2006.01)
(Continued)

(52) U.S. Cl.
CPC .......... *H01L 33/0093* (2020.05); *H01L 21/68* (2013.01); *H01L 21/6835* (2013.01);
(Continued)

(58) Field of Classification Search
CPC ....................... H01L 21/68; H01L 2221/68368
See application file for complete search history.

(56) References Cited

U.S. PATENT DOCUMENTS

| 7,744,770 B2 | 6/2010 | Doi et al. |
| 8,056,222 B2 | 11/2011 | Pique et al. |

(Continued)

FOREIGN PATENT DOCUMENTS

| CN | 105493297 | 4/2016 |
| DE | 102010049857 | 3/2012 |

(Continued)

OTHER PUBLICATIONS

English Translation of International Preliminary Report on Patentability for International (PCT) Patent Application No. PCT/EP2017/074336, dated Jan. 3, 2019, 5 pages.

(Continued)

*Primary Examiner* — Jay C Chang
*Assistant Examiner* — Mikka Liu
(74) *Attorney, Agent, or Firm* — Sheridan Ross P.C.

(57) ABSTRACT

A method and a device for carrying out the method for transferring electronic components from a carrier substrate to a receiving substrate. The method comprises a positioning step in which a carrier substrate on which a plurality of electronic components arranged in a grid each adhere to a corresponding adhesion site by means of an adhesion which can be detached by laser radiation is positioned, in particular oriented, relative to a receiving substrate; a transferring step in which, while the positioning of the carrier substrate relative to the receiving substrate is maintained, the adhesion sites of the components of a transfer unit consisting of at least two of the components arranged on the carrier substrate are selectively irradiated with laser radiation such that the adhesion of the components of the transfer unit is
(Continued)

selectively detached thereby from the carrier substrate at these adhesion sites, and the components of the transfer unit are each transferred to a grid position on the receiving substrate corresponding to the initial arrangement thereof in the grid on the carrier substrate.

16 Claims, 9 Drawing Sheets

(51) Int. Cl.
*H01L 21/683* (2006.01)
*H01L 25/075* (2006.01)

(52) U.S. Cl.
CPC .............. *H01L 25/0753* (2013.01); *H01L 2221/68368* (2013.01); *H01L 2221/68381* (2013.01)

(56) References Cited

U.S. PATENT DOCUMENTS

| | | | |
|---|---|---|---|
| 8,361,268 | B2 | 1/2013 | Mizuno et al. |
| 9,034,674 | B2 | 5/2015 | Speier et al. |
| 2002/0064032 | A1 | 5/2002 | Oohata |
| 2005/0212007 | A1 | 9/2005 | Daniels et al. |
| 2009/0215208 | A1* | 8/2009 | Coe-Sullivan ......... B82Y 20/00 438/22 |
| 2011/0151588 | A1 | 6/2011 | Ashdown et al. |
| 2012/0309167 | A1 | 12/2012 | Park et al. |
| 2013/0015472 | A1* | 1/2013 | Lo ...................... H01L 25/0753 257/88 |
| 2013/0285259 | A1 | 10/2013 | Han |
| 2016/0240516 | A1 | 8/2016 | Chang |
| 2017/0162552 | A1* | 6/2017 | Thompson ............ H01L 25/167 |
| 2017/0338199 | A1 | 11/2017 | Zou et al. |

FOREIGN PATENT DOCUMENTS

| | | |
|---|---|---|
| JP | 2002-314053 | 10/2002 |
| KR | 1020110047781 | 5/2011 |
| WO | WO 2010/036304 | 4/2010 |
| WO | WO 2014/169928 | 10/2014 |

OTHER PUBLICATIONS

International Search Report prepared by the European Patent Office dated Dec. 14, 2017, for International Application No. PCT/EP2017/074336.

* cited by examiner

METHOD AND DEVICE FOR TRANSFERRING ELECTRONIC COMPONENTS BETWEEN SUBSTRATES

CROSS REFERENCE TO RELATED APPLICATIONS

This application is a national stage application under 35 U.S.C. 371 and claims the benefit of PCT Application No. PCT/EP2017/074336 having an international filing date of 26 Sep. 2017, which designated the United States, which PCT application claimed the benefit of German Patent Application No. 10 2016 221 533.7 filed 3 Nov. 2016, the disclosures of each of which are incorporated herein by reference in their entireties.

The present invention relates to a method and a device for transferring electronic components from a carrier substrate to a receiving substrate. The electronic components can in particular be light emitting diodes (LEDs), which are to be transferred from a semiconductor wafer serving as a carrier substrate to a target substrate which represents a base area of an LED-based screen, the pixels of which contain the transferred LEDs as light sources.

Many modern display devices, in particular LED display devices such as for example LED computer monitors or television screens, each contain a large number of electronic components serving as individual light sources, in particular LEDs. The electronic components can in particular be single semiconductor components, as is also the case with LEDs, or integrated circuits containing several components. In the production of such semiconductor components, a plurality of semiconductor components of the same type are regularly produced together on a single semiconductor wafer, whereby the components are usually present in a grid-like arrangement on the semiconductor wafer.

In a conventional manufacturing process, one of the main surfaces of such a fully processed semiconductor wafer is adhesively bonded to an adhesive film (wafer film, e. g. "thermal release tape" or "UV tape") which serves as a carrier substrate, and the semiconductor wafer is separated into the individual components by a suitable cutting process, which can in particular include sawing or grinding processes. The separated components remain attached to the carrier substrate, which has not been separated, at corresponding respective adhesion sites where they touch the carrier substrate. During the further processing of these semiconductor wafers for the production of electrical devices and systems, the components then need to be detached from the carrier substrate and transferred to a target substrate, such as a circuit board or a base substrate of a display device. The detachment of the individual components from their respective adhesion sites can be achieved in particular by means of local heat input (e. g. "thermal release tape" as carrier substrate) or radiation-induced material conversion (e. g. UV-sensitive tape as carrier substrate), as described in detail in WO 2010/036304 A2. The adhesion of the components to the carrier substrate is eliminated or reduced to such an extent that the components are detached. The local energy input which is required for this, in particular the heat input, can be provided by means of a laser, as described, for example, in U.S. Pat. No. 8,361,268 B2 with regard to LEDs for the manufacture of a display device. The carrier substrate and the target substrate are positioned relative to each other and are repositioned for each transfer step relative to the laser beam of the laser, so that one component is detached and transferred for each position.

In particular in the manufacture of LED display devices, it is often necessary to transfer a very large number of individual components (LEDs) in this manner. For example, a screen with "High Definition (HD)" resolution that is common today has approximately 2 million pixels, each of which is composed of three differently colored LEDs (usually according to the familiar red-green-blue or RGB scheme). Accordingly, in order to construct such a screen, approximately 6 million individual LEDs must be transferred to the base substrate of the display device, which serves as the target substrate. Compared to this, even more recent generations of screens (in particular those with 4K or 8K "Ultra High Definition" or UHD resolution) have a resolution which is even significantly higher, so that the number of LEDs to be transferred is accordingly also increased by a multiple.

Several other types of components, such as for example RFID chips, also require a large number of such components to be transferred from the carrier substrate to one or more target substrates (e. g. smart labels) within a very short period of time in the manufacture of products containing such chips.

It is an object of the present invention to further increase the achievable throughput in the transfer of electronic components from a carrier substrate to a receiving substrate, which can in particular be a target substrate.

This problem is solved according to the teaching of the independent claims by a method according to claim 1 for transferring electronic components from a carrier substrate to a receiving substrate, and a device according to claim 15 for carrying out the method. Various embodiments and further developments of the invention are the subject of the dependent claims.

Accordingly, a first aspect of the invention relates to a method for transferring electronic components from a carrier substrate to a receiving substrate. The method comprises the following steps: a positioning step, in which a first carrier substrate on which a plurality of electronic components which are arranged in a grid each adhere at a corresponding adhesion site by means of an adhesion releasable by laser radiation, is positioned, in particular aligned, relative to a receiving substrate; a first transfer step in which, while the relative positioning of the carrier substrate to the receiving substrate is maintained, the adhesion sites of the components of a first transfer unit consisting of at least two of the components arranged on the carrier substrate are selectively, and in particular simultaneously or sequentially, irradiated with laser radiation in such a way that the adhesion of the components of the first transfer unit is thereby selectively released from the carrier substrate at these adhesion sites and the components of the first transfer unit are each respectively transferred to a grid position on the receiving substrate which corresponds to their initial arrangement in the grid on the first carrier substrate.

A "carrier substrate" in the sense of the invention is to be understood to be a body, in particular a disc-shaped body, on which a plurality of electronic components are adhesively arranged. The carrier substrate can in particular be an adhesive film, preferably a so-called "wafer film", which will be known to one skilled in the art from the manufacture of semiconductor products.

A "receiving substrate" is analogously to be understood to be a body, in particular a disc shaped body, which is arranged to receive, on one of its surfaces, a plurality of electronic components, which are transferred from the carrier substrate to the receiving substrate. In particular, the receiving substrate may be identical to the target substrate on which the electronic components are ultimately to be used, e. g. as part of a circuit, a device or a system. In addition, a receiving substrate can also be in the form of an intermediate carrier substrate, to which the electronic components are only temporarily transferred within the framework of the method, in order to be transferred in a subsequent step from the intermediate carrier substrate to a further intermediate carrier substrate or already to the target substrate.

A "grid" in the sense of the invention is a regular arrangement of positions or surface elements on a surface. In particular, the surface elements together can represent a subdivision of the surface. In a preferred variant, the arrangement of the surface elements forms a matrix and preferably the surface elements each have a rectangular shape. For example, the matrix-shaped arrangement of the light points, in particular of the individual light sources (e. g. LEDs), as well as that of the pixels of a screen formed from several differently colored light sources, represents a "grid" in the sense of the invention. Each of the surface elements corresponds to a "grid position", and an electronic component can be placed respectively at each grid position of the carrier substrate or the receiving substrate.

If the components of a transfer unit are each transferred respectively to a grid position on the receiving substrate which "corresponds" to their initial arrangement in the grid on the carrier substrate, this means in the sense of the invention that the component arrangement which is formed by the transferred components of the transfer unit on the receiving substrate at least approximately forms a grid in which the transferred components of the transfer unit have the same relative arrangement of their grid positions to each other as before in the grid on the carrier substrate. A congruence, in a geometric sense, of the two grids on the one hand on the carrier substrate and on the other hand on the receiving substrate is however not absolutely necessary, although this is usually advantageous.

The method in accordance with the invention makes it possible to transfer a transfer unit consisting of a plurality of electronic components from the carrier substrate to the receiving substrate within the framework of a single transfer step without the need to change the position of the carrier substrate relative to the receiving substrate or the position of both relative to a laser light source. The laser radiation required in order to detach the components can be achieved in particular by means of selective sequential orientation of a laser beam, for example by means of one or more movable mirrors, onto the adhesion sites of the components to be transferred during the transfer step, as is possible in particular by means of a laser scan head. In this way, it is possible to reduce or even completely eliminate mechanical movements of the substrates and the associated oscillations and their decay times, and the throughput for the transfer can be increased due to the fast alignability of the laser beam. The method can be used to advantage in particular if a fixed known geometric arrangement of several electronic components on a substrate is to be generated, as is the case in particular with the arrangement of light emitting diodes on a base substrate of a screen.

In the following, preferred embodiments of the method and their further developments are described, which each can be combined with one another as well as with the other aspects of the invention described below, unless this is expressly excluded.

In accordance with a first preferred embodiment, the method further comprises at least one carrier substrate changing step following a preceding transfer step, in particular the first transfer step, in which, instead of the carrier substrate used in the immediately preceding transfer step, a further carrier substrate is positioned relative to the receiving substrate. A plurality of electronic components arranged in a grid, preferably corresponding to the grid of the first transfer substrate, again each adhere to the further carrier substrate at a respective adhesion site by means of an adhesion which can be released by laser radiation. The method further comprises a further transfer step which follows this substrate changing step in which, while the relative positioning of the further carrier substrate relative to the receiving substrate is maintained, the adhesion sites of the components of a further transfer unit consisting of at least two of the components arranged on the further carrier substrate are selectively, in particular simultaneously or sequentially, irradiated with laser radiation in such a way that the adhesion of the components of the further transfer unit is thereby selectively released from the further carrier substrate at these adhesion sites and the components of the further transfer unit are each transferred to a grid position on the receiving substrate which corresponds to their initial arrangement in the grid on the further carrier substrate. These grid positions on the receiving substrate are preferably not yet occupied by other components, although other variants are also conceivable in which components are arranged one on top of the other, in particular in the sense of a "3D integration" or a "stacking", as it is referred to.

This enables electronic components to be transferred onto the same receiving substrate, which electronic components originate from different carrier substrates and which can in particular also have different types depending on the respective carrier substrate and which can, for example, be LEDs of different colors. Preferably, in order to optimize the efficiency and the throughput of the method, all the components of the first carrier substrate which are intended to be transferred to the receiving substrate are transferred first as a first transfer unit, then the carrier substrate changing step is carried out, and then in each subsequent transfer step all the components of the associated further carrier substrate intended for transfer to the receiving substrate are transferred to the receiving substrate. Further carrier substrate changing steps may also be provided.

According to a preferred variant of this, the components of the first transfer substrate and of the at least one further transfer substrate each represent electronic light sources, in particular light emitting diodes, and in each of the transfer steps light sources of one type which is different from those of at least one of the other transfer steps are transferred from the respective transfer substrate to the receiving substrate. In this way, a plurality of groups of light sources are arranged there by means of several of the transfer steps, wherein each of the groups contains light sources of at least two of the types whose grid positions on the receiving substrate are arranged immediately adjacent to one another. In this way, any number of further transfer steps can follow the first transfer step one after the other, wherein a carrier substrate changing step takes place between each two successive transfer steps. For example, a base substrate of an LED screen, which is composed of light sources in the form of LEDs of three different light colors (e. g. red, green, blue), can be equipped with the LEDs by means of three successive transfer steps, wherein preferably in each transfer step only LEDs of one of the light colors are transferred from a corresponding carrier substrate equipped with LEDs of only this light color to the receiving substrate.

In a further preferred variant of this, at least one of the groups is formed in such a way that the quantity consisting of the respective numbers of lighting means in the respective group (P) which comprise the same type (B) contains at least two different and non-zero numbers. Preferably, all groups are formed in this way, in particular by detaching a different number of components per group and transfer step. Each group may, in the case of a screen display, correspond in particular to a pixel composed of several light sources. According to this variant, in such a pixel the number of light sources of a first type, such as for example a first light color, is different from the number of light sources of a second different type, such as for example a second light color which is different from the first light color. As a simple example, one can imagine a pixel which is made up of four LEDs, wherein three of the LEDs each have a different light color, while the fourth light source has the same light color as one of the three other light sources. In this way it is possible to configure the groups in a flexible way. In the case of the aforementioned pixel, for example, a particular light color can be amplified, or differences in brightness can be compensated by adding further LEDs of a "dim" light color.

According to a further preferred embodiment, an intermediate carrier substrate with an alignment function is used as the receiving substrate. The method further comprises an alignment step in which the components which have been transferred to the intermediate carrier substrate by means of a preceding transfer step are spatially aligned according to a predetermined target grid by means of the alignment function thereof. In addition, a transfer step is provided in which the components which have been arranged in the target grid are then transferred from the intermediate carrier substrate to a target substrate while their arrangement in accordance with the target grid is maintained. The use of such an intermediate carrier substrate can advantageously be used to initially align the components which have been detached from the carrier substrate as accurately as possible according to the target grid before they are then transferred to the target substrate. In this way, the accuracy of the placement of the components in the target grid can be further increased when compared to a method in which a direct transfer from the carrier substrate to the receiving substrate occurs. This may in particular be appropriate if unavoidable inaccuracies occur in the placement of the detached components on the intermediate carrier substrate during the detachment process of the components, which inaccuracies first need to be corrected before the components are transferred to the target substrate with the required accuracy regarding their placement.

According to a preferred variant of this, the alignment function is provided by means of positioning edges or cavities which are present on the intermediate carrier substrate. In this case the alignment can in particular be achieved by shaking the intermediate carrier substrate, vibrating the intermediate carrier substrate or tilting the intermediate carrier substrate with respect to the horizontal, in order to move the components which are present thereupon and which have been detached from the carrier substrate, in the direction of the respective positioning edges or cavities to which they are to be aligned.

According to a further preferred variant, the transfer step is performed by means of a multi-transfer tool which is arranged to simultaneously transfer a plurality of electronic components, in particular a plurality of preferably more than 100 and particularly preferably more than 1000 electronic components, from the intermediate carrier substrate to the target substrate in order to arrange the transferred components there in accordance with the target grid. In this way, the throughput of the method can be further increased and, in particular, a purely sequential process for transferring the individual components from the intermediate carrier substrate to the target substrate can be avoided. Multi-transfer tools of this kind are often used in the manufacture of electronic devices and are familiar to those skilled in the art.

According to a further preferred variant, in addition to the first transfer step, at least one further transfer step takes place and, in at least two of the transfer steps, different intermediate substrate carriers with an alignment function corresponding to the same target grid are used as receiving substrates. The alignment step is performed in relation to each of these intermediate carrier substrates. In the transfer step, the aligned components are then transferred from the different intermediate carrier substrates to the same target substrate and are arranged there according to the target grid and a predetermined positioning relative to one another. In this way, it is possible, in particular, to achieve a parallelization of the method, in which several carrier substrates can be processed in parallel before their components are finally transferred to the same target grid on the target substrate. This is particularly advantageous with regard to the manufacture of screens, in particular LED screens, since there the LEDs of different colors, which each originate from a corresponding wafer on a carrier substrate, which, due to manufacturing constraints, typically contains only LEDs of one color, can first be detached in parallel from their respective carrier substrate and finally be assembled into pixels of the screen in the transfer step.

According to a further preferred embodiment, at least two transfer steps are carried out, each using the same carrier substrate, and in each of these transfer steps the same irradiation pattern is used with respect to the relative arrangement of the adhesion sites selectively irradiated by the laser radiation. This irradiation pattern may in particular correspond to a regular matrix-like pattern, which is advantageous in particular in the manufacture of screens, in which the individual pixels are arranged in a rectangular matrix. After each of these transfer steps, if followed by a further transfer step with this carrier substrate, the relative position of this carrier substrate with respect to the receiving substrate is shifted in such a way that in the next further transfer step, using the same irradiation pattern, another of the components of this carrier substrate is detached at each of the adhesion sites thus irradiated and transferred to the receiving substrate. In this way, the detaching of the individual components from the carrier substrate can be carried out systematically according to the irradiation pattern, which in particular remains constant. In this way, the carrier substrate can be scanned in particular in a grid-like manner for the purpose of detaching the corresponding components, which serves to increase the process efficiency and to simplify the corresponding control of such a method.

According to a preferred variant to this, during the course of the shifting of the relative position of the carrier substrate with respect to the receiving substrate, after each transfer step that is followed by a further transfer step, the relative position of the irradiation pattern with respect to the carrier substrate is shifted by at least one grid position along at least one grid dimension so that thereafter the irradiation pattern is again directed to adhesion sites of components on the carrier substrate that have not yet been detached. Here, a grid position corresponds to an adhesion site or a component. In addition, the relative position of the carrier substrate with respect to the receiving substrate is shifted in such a way that the transfer unit transferred in the next further transfer step in accordance with the irradiation pattern is transferred to grid positions on the receiving substrate which are not yet occupied by components due to previous transfer steps. The shifting of the relative position of the irradiation pattern with respect to the carrier substrate by at least one grid position can in particular be carried out by a corresponding shifting of only the carrier substrate, only the irradiation pattern or both.

According to a further preferred variant, the shifting of the relative position of the carrier substrate with respect to the receiving substrate is carried out by one grid position or by a number of grid positions which corresponds to the dimensions of the transfer unit as a whole. Preferably, the shift corresponds to a shift by the dimensions of a transfer unit, so that the components which belong to the corresponding transfer units transferred one after the other are then arranged next to each other in blocks on the receiving substrate.

According to a further preferred embodiment, at least two transfer steps are carried out using the same carrier substrate, whereby a subdivision, in particular a virtual subdivision, of the carrier substrate into a plurality of different, respectively limited partial areas is defined. In each of these transfer steps, a transfer unit is transferred which exclusively has components which originate from a corresponding one of these partial areas. Two partial areas, each of which is assigned to a different one of two immediately successive ones of these transfer steps, are not arranged adjacent to one another on the carrier substrate, i. e. at least one partial area lies between them. Between the two immediately successive transfer steps, the relative position of the carrier substrate with respect to the receiving substrate is shifted in such a way that the two transfer units of these two transfer steps are arranged so as to be interleaved with one another or arranged adjacent to one another on the receiving substrate. In this regard, the term "interleaving" is to be understood to mean that the surface areas on the receiving substrate which are occupied by the two transfer units overlap at least partially, but that the components of the two transfer units are arranged at different grid positions of the grid which results from the two transfer units as a whole.

This embodiment can be advantageously used in particular if on the carrier substrate there is a significant variance in terms of quality or other properties of the components, in particular electrical or optical properties of the components, but it is desired to achieve the best possible mixing in the interest of uniformity on the target substrate. Again, this applies in particular in the case of light sources, in particular LEDs, where the variance can occur due to the production method, in particular with regard to the brightness or the color tone, of the individual components from the partial areas (binning), but on a screen constructed from such light sources a visual impression which is as homogeneous as possible should be created. In this way, in the interest of process efficiency and increased throughput, in particular additional measures, such as sorting processes for the components, can be dispensed with, which would also generally require additional, time-consuming handling measures.

According to a further preferred embodiment, at least two transfer steps are carried out, wherein each of these uses the same carrier substrate, whereby a subdivision, in particular a virtual subdivision, of the carrier substrate into a plurality of different, respectively limited partial areas is defined. In each of these transfer steps, a transfer unit is transferred, each of which exclusively has components which originate from a corresponding one of these partial areas. Between the two immediately successive transfer steps, the relative position of the carrier substrate with respect to the receiving substrate is shifted in such a way that the two transfer units of these two transfer steps are arranged so as to be inter-leaved with one another on the receiving substrate. For this purpose, the different partial areas of the carrier substrate, from each of which a transfer unit originates, are preferably defined as the largest possible disjunctive partial areas of the carrier substrate in order to achieve the best possible homogeneity of the electrical, optical or other properties of the components already within the transfer units. The interleaving also further increases the homogeneity of the resulting target grid on the receiving substrate, which again promotes the desired homogeneity of the visual impression, in particular in the case of screens with components serving as light sources. The additional measures mentioned above, such as for example sorting processes etc., can also again be avoided.

According to a further preferred embodiment, the receiving substrate comprises or is a belt which is continuously movable along a direction of movement. During at least one transfer step, components are transferred from the associated carrier substrate onto the belt by means of a fixed detachment rate. The distance of the components transferred to the receiving substrate from each other is adjusted with respect to their original corresponding distance on the carrier substrate from each other for the respective transfer step by means of an adjustment of the speed of the movement of the belt. In this way, the distance between the individual components on the receiving substrate from each other can be adjusted or varied in a targeted manner. Also with this embodiment, parallelization is again possible in the sense that several different carrier substrates are initially processed in parallel in a corresponding manner, whereby the corresponding components are transferred to respectively assigned belts, and then, in a further processing step, a transfer to the same target substrate takes place, in particular by means of at least one multi-transfer tool. In this way it is again possible to compose in particular pixels of screens of light sources of different colors, in particular LEDs, as components.

According to a further preferred embodiment, the receiving substrate or the target substrate each represent only one panel of a screen to be produced, which is composed of a plurality of such panels, usually square or rectangular panels. This enables screens to be produced in a simple manner whose surface area significantly exceeds that of the carrier substrates or of semiconductor wafers on the carrier substrates. These can in particular be displays, such as for example for advertising, TV transmission or banner advertising at major events, or displays with an unusual height-to-width ratio. The size of the individual panels is preferably chosen in such a manner that only a single transfer step is required, at least per color of the light sources serving as components, in order to optimize the process efficiency, in particular the throughput.

A second aspect of the invention relates to a device for transferring electronic components from a carrier substrate to a receiving substrate, wherein the device is arranged to carry out the method in accordance with the first aspect of the invention, in particular its embodiments and variants described herein. Accordingly, the details mentioned above in connection with the method also apply, mutatis mutandis, to such a device.

The device preferably comprises a laser scan head for generating at least one laser beam which is configured, in accordance with the invention, selectively to irradiate the adhesion sites of a carrier substrate which is used in the method and thereby to achieve a detachment of the corresponding components at the irradiated adhesion sites. For this purpose, the or each laser beam can preferably be directed to a respective adhesion site in a targeted manner by means of one or more mirrors, whereby the direction of the laser beam can be adjusted accordingly by means of a corresponding orientation and/or movement of the mirror or mirrors. In addition, the device preferably comprises a positioning unit which is arranged to position a carrier substrate on which a plurality of electronic components arranged in a grid each adhere at a corresponding adhesion site by means of an adhesion which can be released by laser radiation, relative to a receiving substrate, in particular also to displace it. In addition, the device preferably comprises a control unit for controlling the laser scan head as well as the positioning unit, which is arranged, in particular by means of corresponding programming, to carry out, in cooperation with the laser scan head and the positioning unit, the method in accordance with the first aspect of the invention, in particular in accordance with one of its embodiments and variants described.

Further advantages, features and possible applications of the present invention result from the following detailed description with reference to the figures.

Figure 9:
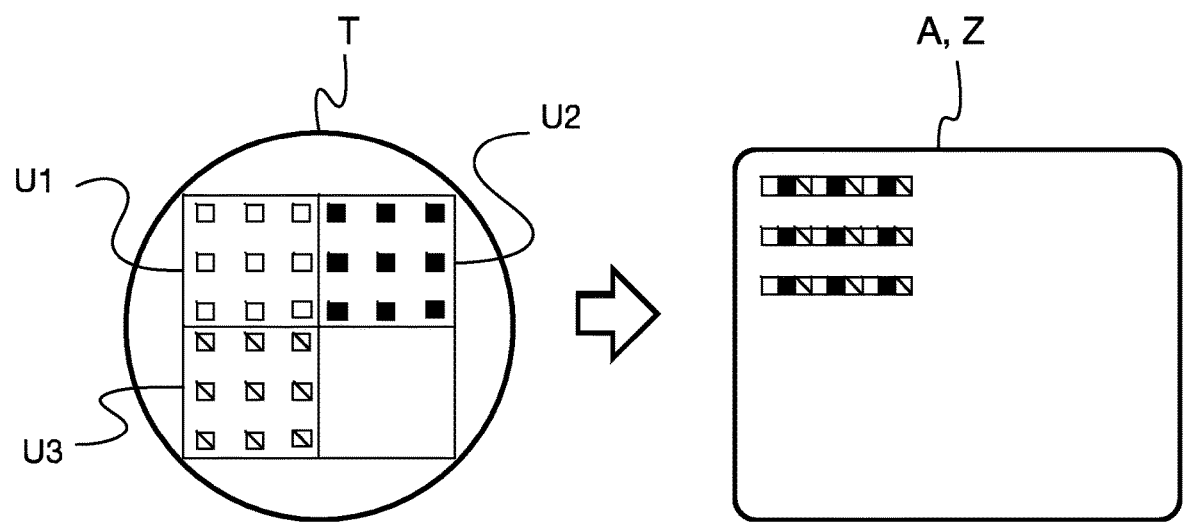
Figure 10:
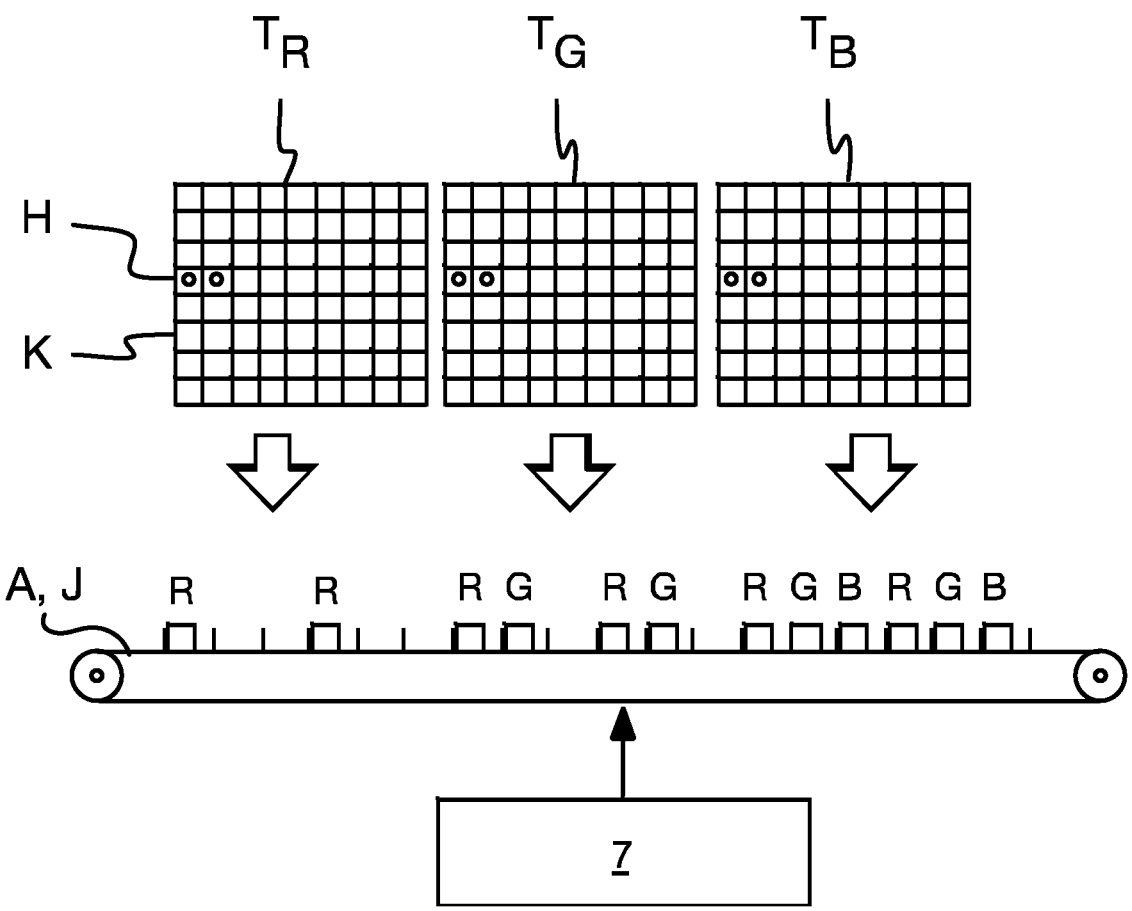

FIG. 9 shows an illustration explaining a further embodiment of the invention, which is in particular advantageous for screens, in which transfer units are selected from different areas of the same carrier substrate and are arranged on the receiving substrate in a manner in which they are interleaved with each other; and FIG. 10 shows an illustration for transferring the components from a carrier substrate to a receiving substrate which is constructed in the form of a continuously moving belt, in accordance with a preferred embodiment of the invention.

In the following figures, the same reference signs are used throughout for the same elements of the invention, or for elements of the invention which correspond to each other.

Figure 1:
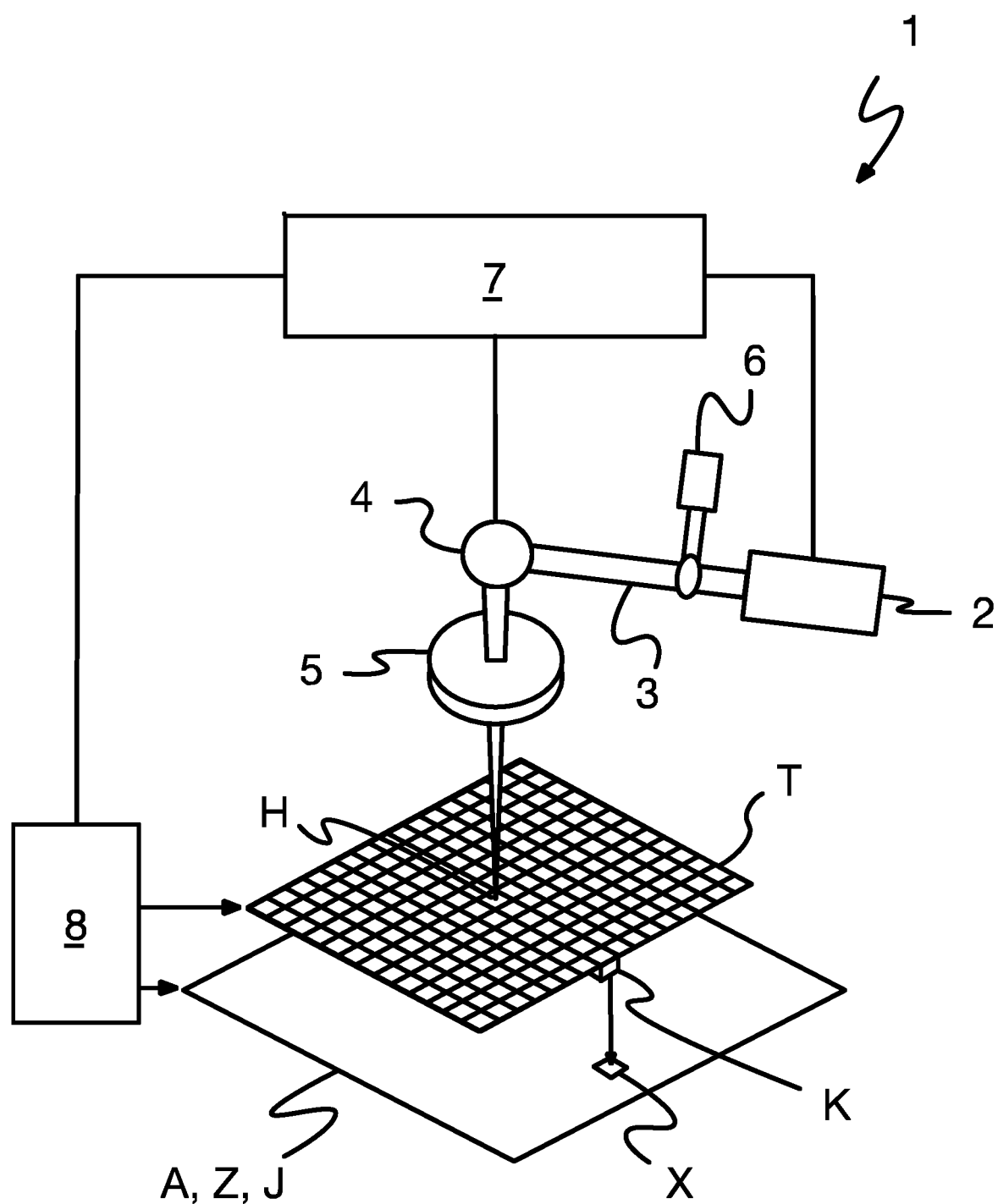
FIG. 1 shows schematically a device for transferring electronic components from a carrier substrate to a receiving substrate, in accordance with a preferred embodiment of the invention.

First, reference is made to FIG. 1. The device 1, illustrated therein in accordance with a preferred embodiment of the invention, for transferring electronic components between substrates comprises a laser 2 which is arranged to emit a laser beam 3, the spectrum of which is preferably located in the visible part of the electronic spectrum, without necessarily being limited to this. The laser beam is directed onto a scan head 4, which can in particular comprise one or more mirrors which can be moved in a controlled manner in such a way that, using this, the laser beam 3 can be deflected in a targeted manner and selectively directed through an optical system 5 onto certain locations of a carrier substrate T. The optical system may, in particular, comprise a single lens or a lens system.

In this manner, the carrier substrate T can be scanned, in particular systematically, with a predetermined irradiation pattern which is generated by sequential selective orientation of the laser beam. The carrier substrate T is preferably a wafer film (hereinafter referred to as "film") which is preferably at least partially transparent to the light of the laser and on whose side facing away from the laser beam 3 a semiconductor substrate (wafer) is attached in a planar, material-bonded manner (in particular by means of adhesive bonding). The semiconductor substrate contains a large number of electronic components K (in particular chips), which are arranged in a grid-like manner and which are in general, though not necessarily, of the same type, and which may in particular be LEDs. The components are already separated and are only held together by the wafer film (hereinafter referred to as "film") to which they adhere. The laser beam 3 directed towards the carrier substrate T is directed, in the course of the selective orientation, towards the adhesion site H between the film and a respective one of the components K in order to eliminate, by means of energy input, in particular heat input, the adhesion caused by the material bond at this adhesion site and thus to detach the corresponding component K from the film in such a way that it falls off the film and falls, on a receiving substrate A arranged parallel to the carrier substrate T, at a grid position X corresponding to its original position in the grid on the carrier substrate T. The receiving substrate A can in particular already represent a target substrate Z on which the corresponding component K is finally to be arranged and to be used. As an alternative to this, the receiving substrate A can however also only be an intermediate carrier substrate J, on which the component remains only temporarily, before it is positioned, and as a general rule also fastened, on a target substrate Z by means of one or more further steps.

In addition, as shown in FIG. 1, an integrated vision system 6 can be provided, with the aid of which the carrier substrate T can be aligned relative to the laser beam 3 at the beginning of the method. The vision system can in particular be contained in the scan head or, as provided for in FIG. 1 for illustrative purposes, can be constructed separately therefrom. The vision system can also be used to check the position of the carrier substrate (wafer). It uses the same optical path (incl. scan head 4) as the laser 3. Both systems (vision and laser) are calibrated with respect to one another so that a precise positioning of the laser beam (or of its laser spot on the carrier substrate) onto the adhesion site of a component to be detached (chip) is made possible. The substrate is preferably positioned with the aid of markers and a second vision system (not shown). In this way, positioning accuracies of less than 10 µm can be achieved.

The device 1 is not limited to the use of any particular laser system, but the choice of a suitable laser system may be limited by the detachment process. In order to achieve a good focusability, lasers with smaller wavelengths (1064 nm or less) and good beam quality ($M^2$ value <2) are preferably used. Solid state lasers of the Nd:YAG type and newer Nd:YVO4 lasers are therefore well suited, for example. However, the laser is not limited to these types or the wavelength of 1064 nm. A good focusability is particularly important for the ever smaller components or chips to be expected in the future (e. g. for LEDs currently measuring approx. 250 μm, in future <100 μm) and in connection with the use of beam shaping in order to improve the detachment behavior.

The optical system 5 preferably contains a F-Theta lens, as it is referred to, by means of which the laser beam is further focused on the respective adhesion surface H that is currently being irradiated. An F-Theta lens is specially ground so that the focus lies in one plane and not on a spherical surface as with a normal lens. In view of the existing geometry of the device and the use of generally flat carrier substrates (cf. semiconductor wafers), this can be used to achieve the best possible optical imaging. Typically available are F-Theta lenses which are respectively optimized for different wavelength ranges in a wide focal length range between 100 and 420 mm. The focal length determines the working range of the scan head 4 and the focus diameter, so that both are preferably taken into account in the course of designing the device. A value provided by way of example is a working range of 25 cm×25 cm with a focus size<100 μm for a focal length of 360 mm and a wavelength of 1064 nm. Smaller focal lengths result in a smaller working range and a correspondingly smaller focus diameter.

Device 1 further comprises a control unit 7, which is arranged to control the laser 2, the scan head 4 as well as a positioning unit 8, which is configured to vary and adjust the relative position of the carrier substrate T with respect to the receiving substrate A and Z respectively. In particular, the positioning unit 8 may comprise a typical stage on which the receiving substrate rests and which can be traversed continuously or in small discrete steps relative to and parallel to the carrier substrate T located above it. Additionally, the receiving substrate can be moved in a vertical direction so that the placement accuracy can be optimized by means of a small distance between the carrier substrate and the receiving substrate. The control of the laser 2 can relate in particular to switching it on and off, as well as to a control of its light intensity or its laser beam diameter. Using such a device 1, it is possible in principle to achieve transfer rates of up to 2,000 components/second and even higher.

Figure 2:
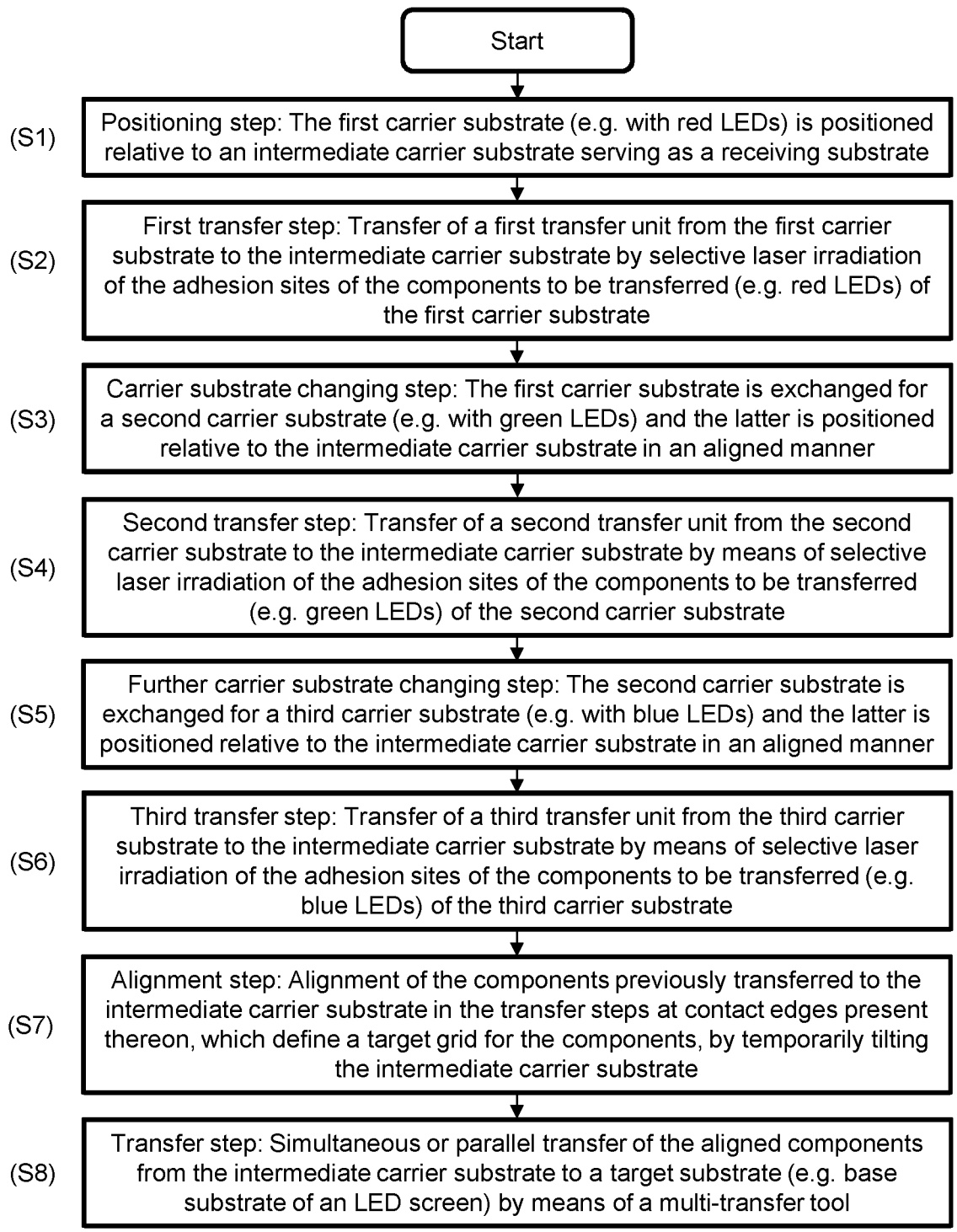
FIG. 2 shows a flowchart illustrating a preferred embodiment of the method in accordance with the invention.

FIG. 2 shows a flowchart in order to illustrate a preferred embodiment of the method in accordance with the invention, to which reference will also be made in the following, in particular in connection with the explanation of FIGS. 3 to 6. The method, which is to be explained here using the example of the manufacture of an LED screen—without being limited to this—, begins with a positioning step S1, in which a first carrier substrate, which for example carries red LEDs as (opto)electronic components K, is positioned relative to a receiving substrate A. With a device according to FIG. 1, this positioning is carried out by means of the positioning unit 8 controlled accordingly by the control unit 7.

After the positioning step S1 has been completed, a first transfer step S2 follows, in which a first transfer unit which consists of a plurality of components K is transferred from the first carrier substrate T to the receiving substrate A by means of selective laser irradiation of the adhesion sites of the components on the first carrier substrate which are to be transferred, as already explained above in connection with FIG. 1. The receiving substrate A can either already be the target substrate Z (base substrate of the LED screen) intended for the later use of the components K, or an intermediate carrier with alignment function, as described here within the framework of the method according to FIG. 2, on which the components detached from the first as well as each further carrier substrate T are only temporarily stored as an interim, and aligned.

In particular if the area of the respective carrier substrate T is greater than, or equal to, the area of the receiving substrate A, all components K which are to be transferred from that respective carrier substrate T may be transferred to the receiving substrate A by means of the respective transfer step, during which the relative position of the respective carrier substrate T to the receiving substrate A remains unchanged. This is followed by a carrier substrate changing step S3, in which the first carrier substrate is exchanged for a second carrier substrate, which for example contains green LEDs, and positioned relative to the receiving substrate (similar to the step S1). This can be done in particular by conveying the receiving substrate A to a second device corresponding to device 1, in which the second carrier substrate is used as the source of the components K instead of the first carrier substrate. Alternatively, the first carrier substrate can be replaced by the second carrier substrate on the original device 1, and the method can further be carried out with the same device 1. This is followed by a second transfer step S4, which is carried out with respect to the second carrier substrate and apart from that is the same as the first transfer step S2, whereby this time a second transfer unit of components (here, green LEDs for example) is transferred to grid positions of the receiving substrate A which are still free.

After a further carrier substrate changing step S5, in which the second carrier substrate is exchanged—in like manner as in the step S3—for a third carrier substrate (which contains, for example, blue LEDs) and positioned relative to the receiving substrate (similar to the step S1), a third transfer step follows, which is similar to the two preceding transfer steps S2 and S4. Here, a third transfer unit of components K (here, blue LEDs for example), is transferred to grid positions of the receiving substrate A which have remained free. Since LED screens are typically composed of LEDs of three different colors, the method can end here if the receiving substrate A is already the target substrate Z, i. e. a base substrate for the LED screen to be manufactured.

However, if the receiving substrate A is only an intermediate carrier substrate J, the step S6 is followed by an alignment step S7, in which the components which have previously been transferred to the intermediate carrier substrate J are aligned by means of alignment devices present on the intermediate carrier substrate J, which may in particular be cavities or positioning edges that define a target grid for the components. This can be done in particular by temporarily tilting the intermediate carrier substrate with respect to the horizontal.

In a final transfer step S8, the components K aligned in the step S7 are transferred simultaneously or in parallel from the intermediate carrier substrate J to a target substrate Z. This can be done in particular using a multi-transfer tool, as has long been known in the semiconductor industry. The step S8 can take the form of a single process step, or it can consist of several partial steps in each of which a subset of the aligned components is transferred.

FIGS. 3 to 9 illustrate various preferred embodiments of the method in accordance with the invention by means of corresponding representations of the carrier substrates T and receiving substrates A, Z or J and the arrangement of the individual components K on them.

FIG. 3 again shows a method of the transfer of components K in the form of differently colored LEDs from three starting substrates $T_R$ (with red LEDs), $T_G$ (with green LEDs) and $T_B$ (with blue LEDs), as can be used in the manufacture of an LED screen. Here, the individual components or LEDs K are arranged in a matrix-like rectangular grid, as is usual for their manufacture on semiconductor wafers. This is illustrated in the upper part of FIG. 3 by means of a corresponding (virtual) subdivision of the carrier substrates $T_R$, $T_G$ and $T_B$ into individual boxes, each of which represent a component K.

In a first transfer step, which corresponds to the step S2 of FIG. 2, a first transfer unit consisting of a plurality of components, which here contains only nine red LEDs K for the sake of simplicity, is transferred from the first carrier substrate $T_R$ to the receiving substrate A, which at the same time already represents the target substrate Z, as described above. Then, a carrier substrate changing step, which corresponds to the step S3 of FIG. 2, takes place, in which the carrier substrate $T_R$ is replaced by the carrier substrate $T_G$. In the same way, a transfer unit which consists of green LEDs is now transferred from this second carrier substrate $T_G$ and, after a further carrier substrate changing step, a transfer unit which consists of blue LEDs, is correspondingly transferred from the third carrier substrate $T_B$ to the receiving substrate or target substrate A or Z.

The target grid on the receiving substrate or target substrate A or Z can be structured into individual pixels P, each of which is composed of three differently colored, grouped LEDs R (red), G (green) and B (blue), as is usually the case with screens available these days. Accordingly, before each of the three transfer steps, the relative position of the corresponding carrier substrate $T_R$, $T_G$ or $T_B$ and of the receiving substrate or target substrate A or Z needs to be adjusted in such a way that the components or LEDs K or R, G or B which are transferred in the respective transfer step end up at the correct positions in the target grid. In addition, the irradiation pattern needs to correspond according to this. In the present example, the regular irradiation pattern, which is directed at the adhesion sites H marked by means of small circles, can assume the same form for all three carrier substrates $T_R$, $T_G$ and $T_B$.

Figure 3:
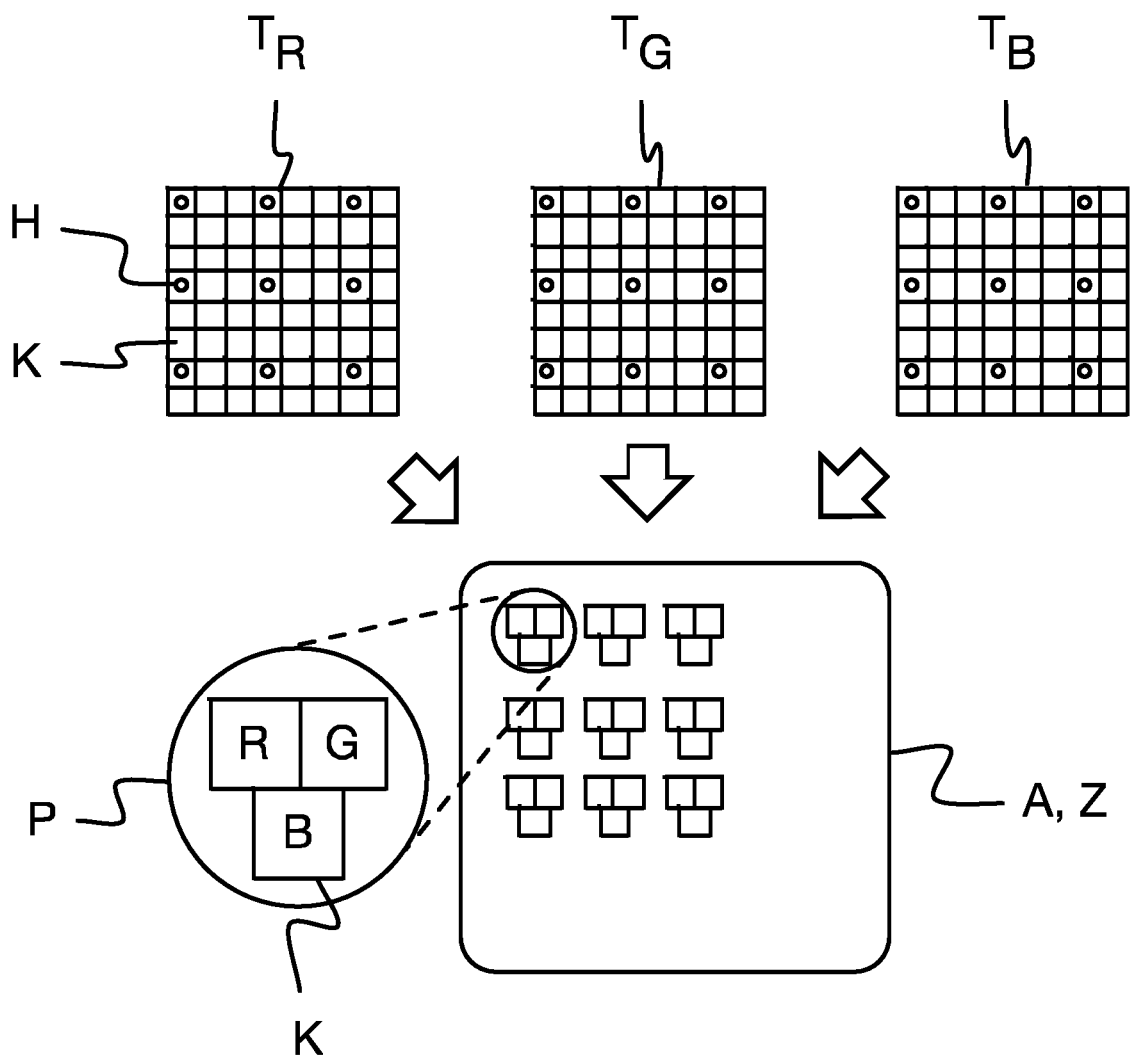
FIG. 3 shows an illustration for assembling an LED screen from LEDs of three different carrier substrates in accordance with a preferred embodiment of the invention, wherein each pixel of the screen is composed of three LEDs of different colors.
Figure 4:
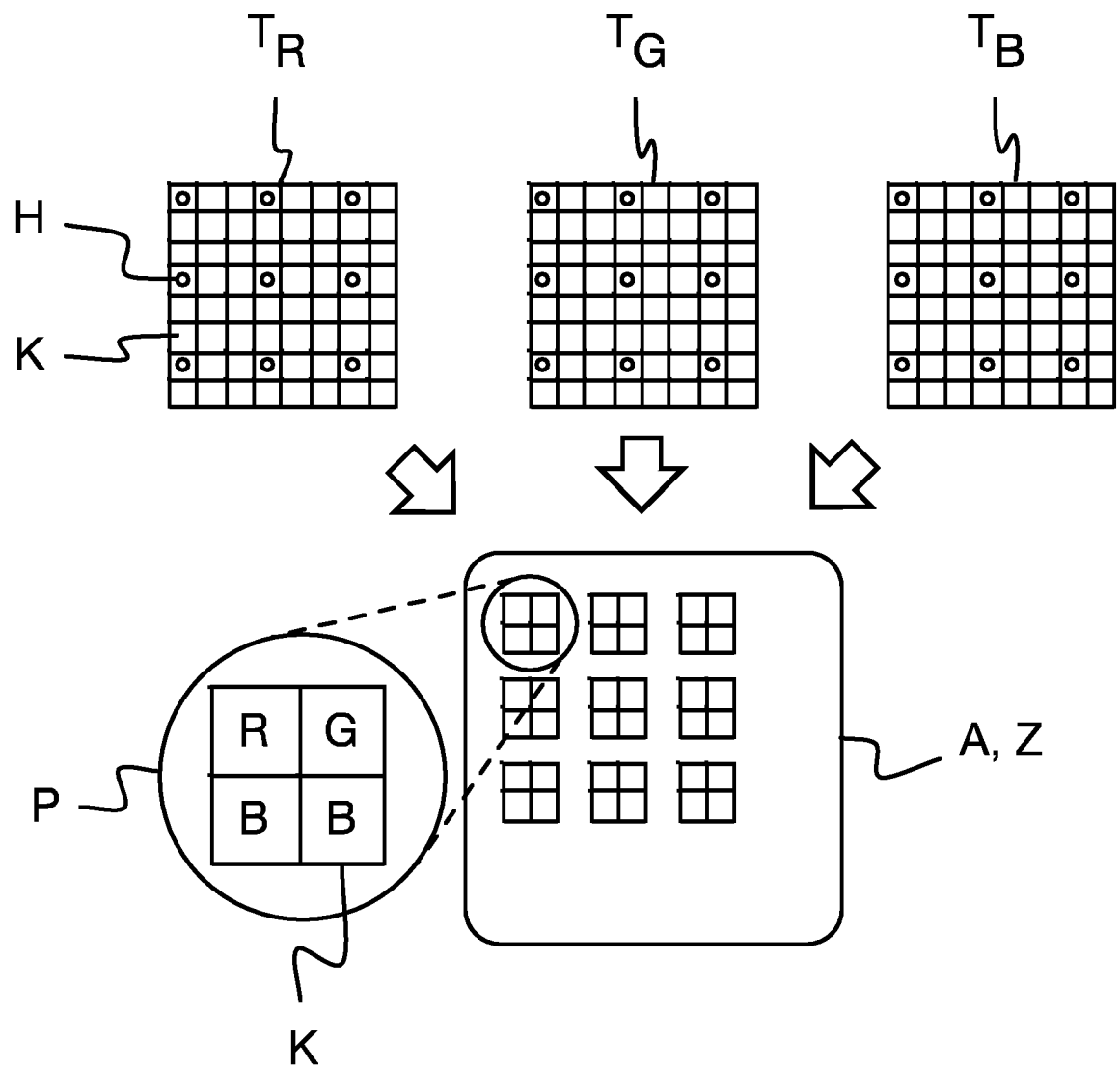
FIG. 4 shows an illustration for assembling an LED screen from LEDs of three different carrier substrates in accordance with a preferred embodiment of the invention, wherein each pixel of the screen is composed of three LEDs of different colors but of different number.

FIG. 4 illustrates a further variant of the method, which differs from the one shown in FIG. 3 only in that, in FIG. 4, each pixel P consists of four LEDs, wherein at least two of the LEDs are of the same type, as here for example two blue LEDs (B). The number of LEDs per type (color) is therefore different here for the pixels P. In this way, the color behavior of a pixel P can be configured in a targeted manner; in particular, differences in brightness between the LEDs of the different colors can be compensated by means of selective doubling, or, more generally, increasing by a multiple, of the number of LEDs of individual colors.

Figure 5:
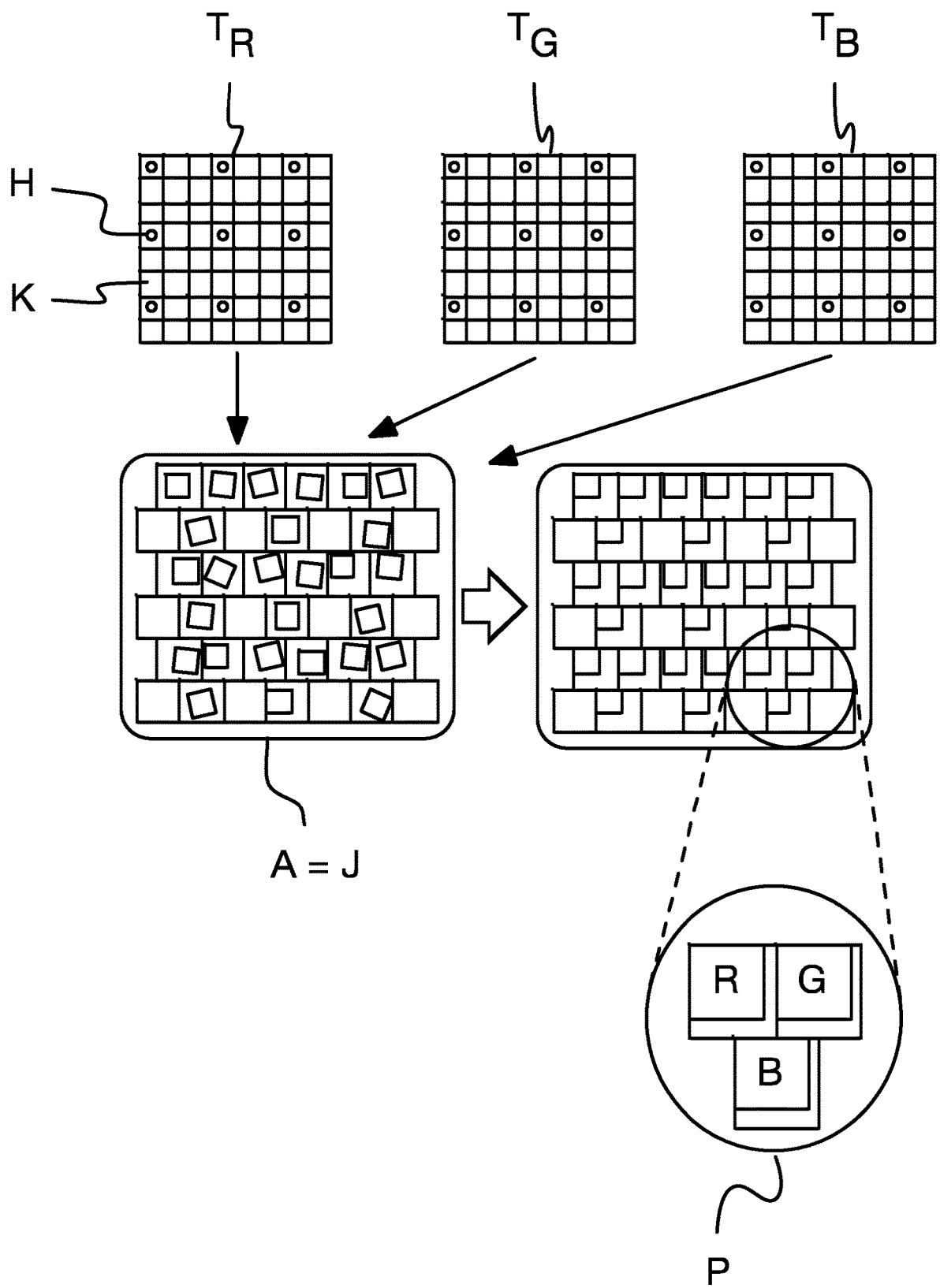
FIG. 5 shows an illustration for assembling an LED screen from LEDs of three different carrier substrates in accordance with a preferred embodiment of the invention, wherein an intermediate carrier substrate is used to align the LEDs prior to their transfer to a base substrate of the screen.

FIG. 5 illustrates a further variant of the method in which, instead of a target substrate Z, an intermediate carrier substrate J is used as the receiving substrate A. The intermediate carrier substrate J has an alignment function, which is for example embodied by means of box-like cavities or positioning strips. During the sequential transfer of the transfer units made up of components K from the various carrier substrates $T_R$, $T_G$ and $T_B$, the detached components are collected in the corresponding cavities or boxes. At this point in time in the method, it is still possible that a somewhat disordered arrangement of the components K on the intermediate carrier substrate J may occur due to the detachment process which takes place during the transfer steps and which is usually subject to tolerances. Therefore, the components K on the intermediate carrier substrate J are aligned in a subsequent alignment step, which corresponds to the step S7 of FIG. 2, in a regular grid, which ideally already corresponds to the target grid on the target substrate Z and which, in particular, already specifies the grouping of LEDs of different colors into pixels P. By means of the transfer step S8, which has already been described in connection with FIG. 2, the transfer of the components from the intermediate carrier substrate J to a corresponding target substrate Z then takes place while the relative arrangement of the components K, which already corresponds to the target grid, is maintained.

Figure 6:
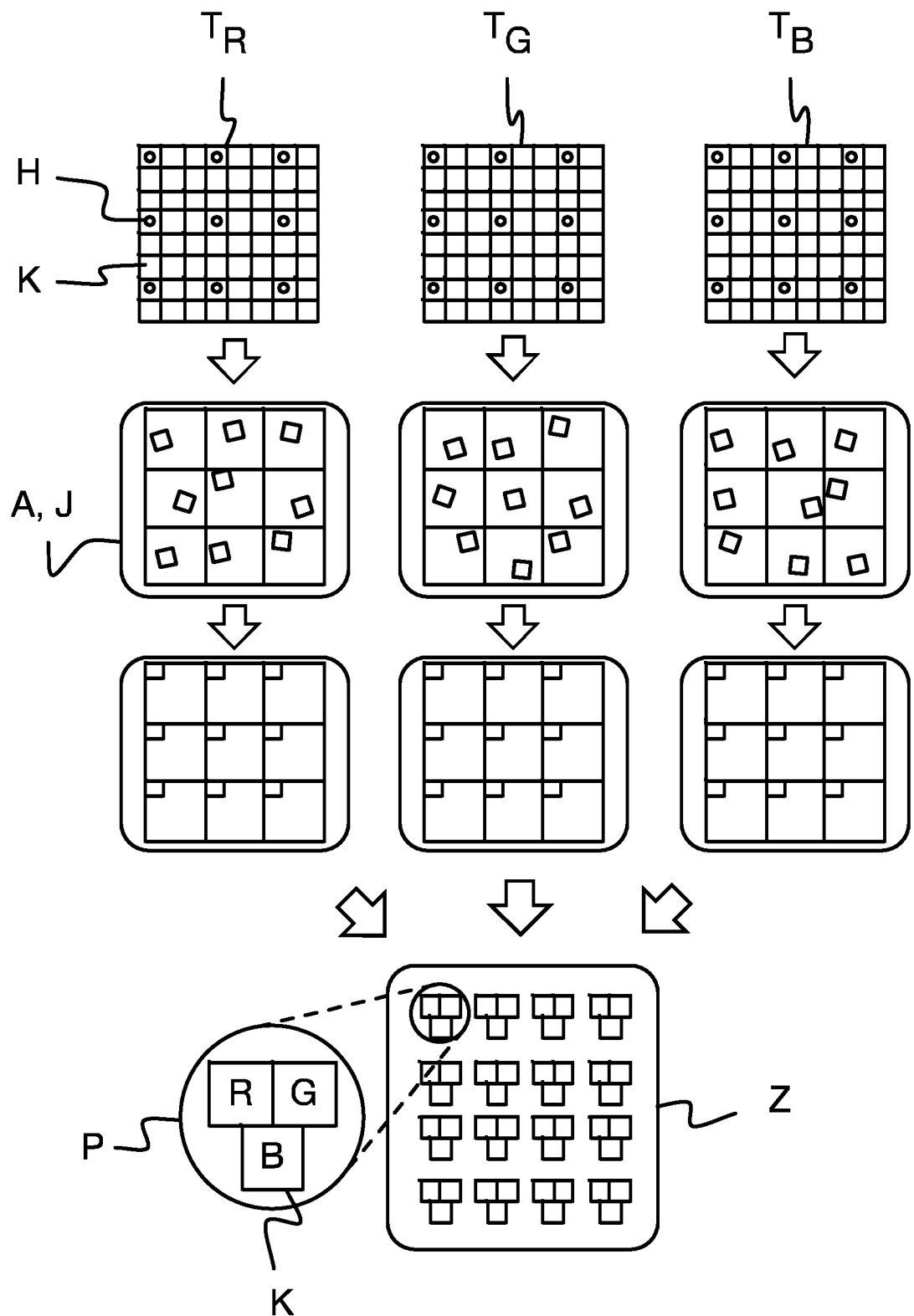
FIG. 6 shows an illustration for the assembly of an LED screen from LEDs of three different carrier substrates in accordance with a preferred embodiment of the invention, wherein for each of the carrier substrates an intermediate carrier substrate is used to align the LEDs prior to their transfer to the same base substrate of the screen.

In a further variant, which is shown in FIG. 6, instead of a single intermediate carrier substrate J, a separate intermediate carrier substrate is used for each carrier substrate $T_R$, $T_G$ and $T_B$ in order to align the respective components K. Apart from that, up to the step S7, the method corresponds to that already described with reference to FIG. 5, whereby here the cavities or boxes of the intermediate carrier substrates can be chosen to be larger due to the use of different intermediate carrier substrates for the different component types, in particular up to four times larger in area than in the method according to FIG. 5. This is advantageous in particular for very small component dimensions, such as for LEDs, since with these, in practice, it is more likely for significant position deviations and orientation deviations to occur during the transfer to the intermediate carrier substrate than with larger components such as integrated circuits for example. In the subsequent transfer step S8, which can again be performed by means of a multi-transfer tool, the arrangements of the components K which are already present in their respective target grids on the different intermediate carrier substrates are then transferred to a common target substrate Z in such a way that the intended grid-shaped pixel arrangement is again created there.

Figure 7:
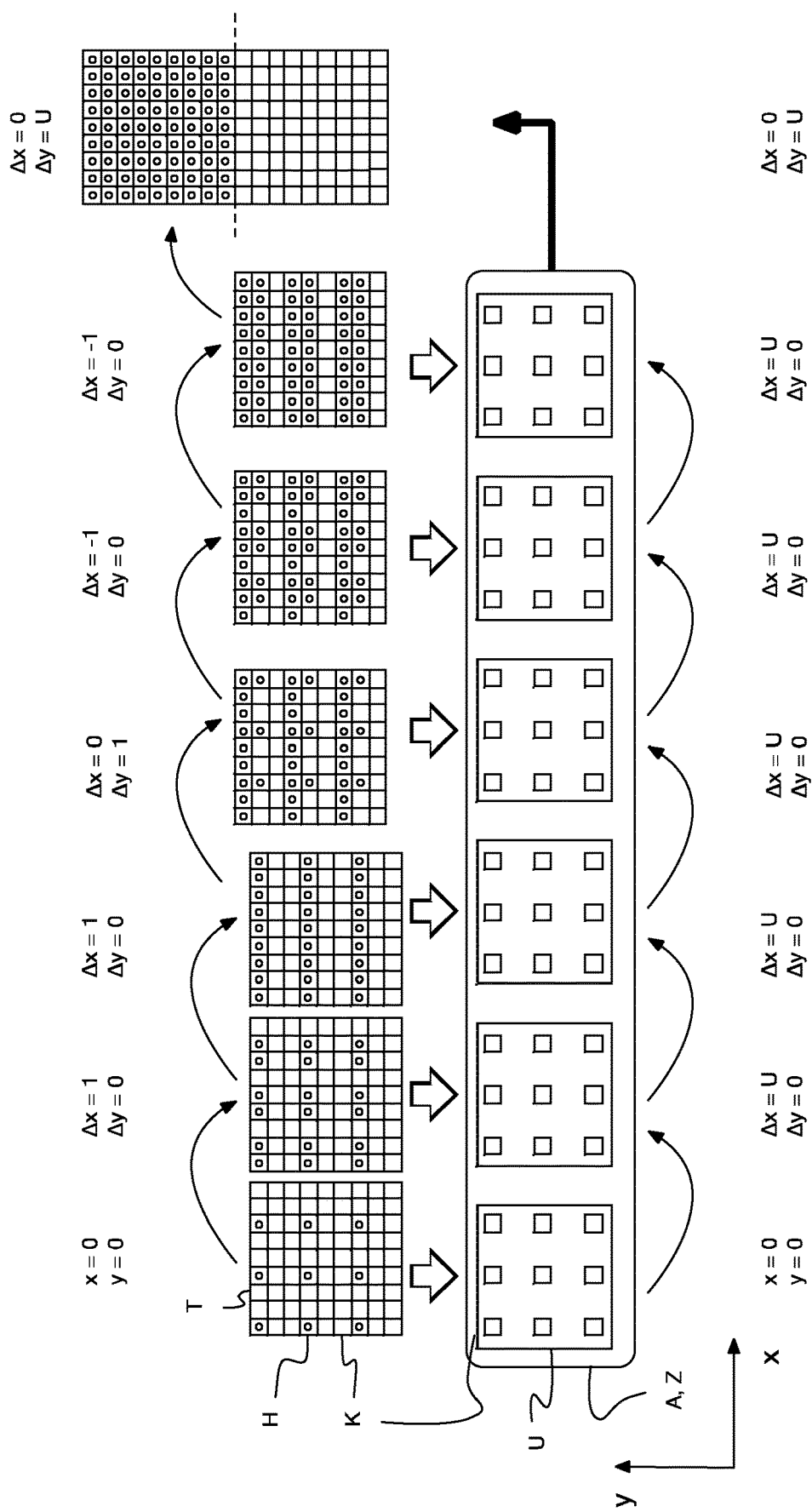
FIG. 7 shows a step by step illustration for a transfer of components from a carrier substrate to a receiving substrate using a fixed irradiation pattern, in accordance with a preferred embodiment of the invention.

FIG. 7 shows a further, step by step illustration of a preferred embodiment of the method, in which components K are transferred from a carrier substrate T to a receiving substrate A, which can in particular also be a target substrate Z, using a fixed irradiation pattern. For the sake of simplicity, this consists here of nine irradiation points in a 3×3 matrix arrangement, as is illustrated by the irradiated adhesion sites H, which are represented by means of small circles, on the carrier substrate marked by means of the reference sign "T". The irradiation pattern can be generated sequentially by a corresponding deflection of the laser beam 3 of FIG. 1 by means of the scan head 4, so that, at any given point in time, only one of the irradiation points of the irradiation pattern is irradiated by the laser beam 3.

FIG. 7 shows the temporal course of a processing of this carrier substrate T within the framework of the method, starting with the initial position at the top left, at which the carrier substrate T is located at the coordinates x=0 and y=0 according to an x-y coordinate system defined in the plane in which the carrier substrate T lies. In the positioning step, the target substrate Z is positioned parallel with respect to the carrier substrate T and at a distance from it. By means of a corresponding laser irradiation according to the irradiation pattern, in a first transfer step the nine adhesion sites H marked with the small circles are irradiated and the corresponding nine components K represented as boxes are transferred to corresponding grid positions on the target substrate Z. The transferred components K form a first transfer unit U.

The carrier substrate T is then shifted in the x-direction by a grid unit "1", which can in particular correspond to the component width, so that the irradiation pattern is now again directed at further components K still present on the carrier substrate T. In addition, before the next transfer step, the target substrate Z is also shifted in the x-direction by the length of a transfer unit U, so that the transfer unit which has been transferred in the second transfer step comes to be positioned next to the transfer unit which has been transferred in the first transfer step. Before a further, third transfer step, which is of the same nature as the two preceding transfer steps, the carrier substrate T as well as the target substrate Z are again shifted in the same way in order to position both for the third transfer step. In this way, after several transfer steps, the corresponding lines in the matrix-like arrangement of the components K on the carrier substrate T are depleted. As soon as these lines are completely emptied, the carrier substrate T is shifted by one grid unit in the y-direction, so that in the next transfer steps, which correspond to the preceding transfer steps, respective ones of the next lines of this component matrix can be detached and transferred component by component.

According to the variant shown here, in the transfer steps for detaching these further lines, the carrier substrate T is shifted in the negative x-direction after each transfer step, i.e. by the grid unit "−1", without this being understood as a mandatory restriction. Once all of the components to be transferred have been transferred from the carrier substrate to the target substrate Z, the method can be continued by exchanging the carrier substrate.

However, FIG. 7 illustrates the case in which the area on the carrier substrate taken up by a transfer unit U only covers a small section of the carrier substrate, so that the method can be continued after this section has been processed as illustrated. This can preferably be done by shifting the carrier substrate, in particular in the y-direction as shown, by a distance corresponding to the length of an edge of a transfer unit, so that the irradiation pattern can now hit a region of the carrier substrate which is still occupied by components K.

Figure 8:
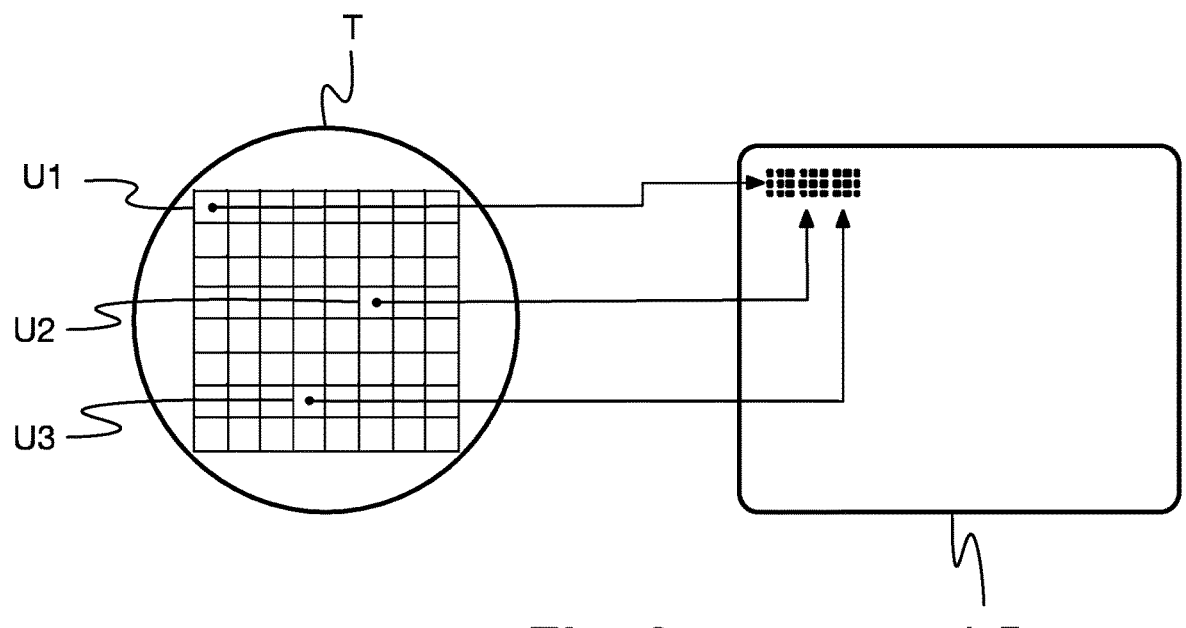
FIG. 8 shows an illustration explaining an embodiment of the invention which is in particular advantageous for screens, in which transfer units which are not adjacent are selected from different areas of the same carrier substrate and are arranged side by side on the receiving substrate.

In particular in the manufacture of LED screens or other display devices which are composed of individual light sources, it is desirable to achieve the greatest possible homogeneity of illumination across the area of the screen. During the manufacture of such light sources, in particular LEDs, unavoidable variations, due to the manufacture, over the area of the carrier substrate (wafer) may however occur. The variations typically occur in particular areas, so that, for example, the components located at the edge can have different electrical or optical properties within a tolerance range than the components arranged centrally on the carrier substrate T. FIGS. 8 and 9 illustrate optimizations of the method in accordance with the invention, which can be used in particular in such situations which are affected by tolerances, in order to achieve the highest possible homogeneity. Although these embodiments are described in detail in the context of display devices and LEDs, the possibilities of their use are not limited to these applications, but rather they exist wherever a corresponding homogeneity of the distribution of the components on the target substrate is required or desirable.

FIG. 8 shows an illustration in order to explain an advantageous embodiment of the invention, in which non-adjacent transfer units U1, U2 and U3 are selected from different partial areas—here marked as boxes—of the same carrier substrate T and are arranged next to each other on the receiving substrate A, which, in particular, can expediently already be the target substrate Z. In this way, a mixing takes place which promotes homogeneity and in which, at least at the level of the individual transfer units, which here are preferably chosen to be rather small in relation to the total area of the carrier substrate or semiconductor wafer, for example 1000 components K per transfer unit U1, U2, U3 if the carrier substrate T contains 10,000 components K or more.

FIG. 9 shows an illustration in order to explain a further advantageous embodiment of the invention, in which transfer units U1, U2, U3 are selected from different regions of the same carrier substrate and are arranged on the receiving substrate in such a way that they are interleaved with each other. In this embodiment, the partial areas from which the transfer units U1, U2, U3 are detached are selected to be as large as possible, so that ideally each transfer unit already extends over several, possibly inhomogeneous regions of the carrier substrate T. Here, the term "interleaving" is to be understood to mean that the surface areas spanned by the respective transfer units overlap each other. This can be achieved in particular by regular nesting of the transfer units, as is shown on the right-hand side of FIG. 9. Also in this way, the homogeneity of the component distribution arranged in the target grid on the target substrate Z can be optimized. The methods from FIGS. 8 and 9 can respectively also be extended to the use of several different component types or carrier substrates, for which purpose corresponding gaps are left free on the target substrate, into which the transfer of the corresponding transfer units from the next carrier substrate then takes place, so that a corresponding mixing in the sense of a homogenization takes place not only for each carrier substrate T individually, but also between the transfer units of different carrier substrates.

Finally, FIG. 10 shows an illustration relating to a further preferred embodiment of the invention. Here, a transfer of components K takes place from a stationary carrier substrate T to a receiving substrate A, which is constructed as a continuously moving belt and which functions as an intermediate carrier substrate J. The components K are detached with a fixed clock rate. The speed of the continuously moving belt which is variable, for example by means of a control device 7, allows the distance between the components K on the intermediate carrier substrate J and thus ultimately also on a target substrate Z, to which the arrangement of the components is transferred, to be varied. By means of several devices 1 positioned in a successive manner, it is also here possible for a group, in particular a pixel P, consisting of different components, in particular light sources (here by way of example again LEDs R, G, B in different colors), to be assembled and then to be transferred to a target substrate Z by means of a multi-transfer tool.

While at least one example embodiment has been described above, it should be noted that there are a large number of variations. It should also be noted that the example embodiments which have been described only represent non-limiting examples, and it is not intended to thereby limit the scope, the applicability or the configuration of the devices and methods described here. Rather, the preceding description will provide the skilled person with instructions for the implementation of at least one example embodiment, whereby it is understood that various changes can be made in the functionality and the arrangement of the elements described in an example embodiment, without deviating from the subject matter respectively defined in the appended claims, as well as its legal equivalents.

LIST OF REFERENCE SIGNS

1 Device for transferring electronic components
2 Laser
3 Laser beam
4 Scan head
5 Optical system, in particular lens or lens system
6 Vision system
7 Control device
8 Positioning unit
A Receiving substrate
H Adhesion site
J Intermediate carrier substrate
K Component, in particular LED
P Pixel
R, G, B Red, yellow or blue light sources, in particular LEDs
T Carrier substrate
U Transfer unit
X Grid position on the receiving substrate or target substrate
Z Target substrate

What is claimed is:

1. A method of transferring electronic components from a carrier substrate to a receiving substrate, wherein the method comprises:

a positioning step in which a first carrier substrate, on which a plurality of electronic components is arranged in a grid and each electronic component is adhered at a corresponding adhesion site by means of an adhesion releasable by laser radiation, is positioned relative to the receiving substrate;

a first transfer step in which, while the relative positioning of the first carrier substrate to the receiving substrate is maintained, the adhesion sites of the electronic components of a first transfer unit consisting of at least two of the electronic components arranged on the first carrier substrate are selectively irradiated with laser radiation in such a way that the adhesion of the electronic components of the first transfer unit is thereby selectively released from the first carrier substrate at the adhesion sites and the electronic components of the first transfer unit are each respectively transferred to a grid position on the receiving substrate which corresponds to the electronic components' initial arrangement in the grid on the first carrier substrate, wherein an intermediate carrier substrate with an alignment device is used as the receiving substrate, the intermediate carrier substrate comprises a belt which is configured to continuously move along a direction of movement and onto which electronic components from the first carrier substrate are transferred by means of a fixed detachment rate during the first transfer step; and an alignment step in which the electronic components which have been transferred to the intermediate carrier substrate by means of the first transfer step are spatially aligned by means of the alignment device thereof.

2. The method according to claim 1, further comprising:

at least one carrier substrate changing step following the first transfer step, in which, instead of the first carrier substrate used in the first transfer step, a second carrier substrate is positioned relative to the receiving substrate, wherein a second plurality of electronic components arranged in a grid adhere to the second carrier substrate at respective adhesion sites by means of an adhesion which are configured to be released by laser radiation; and a second transfer step which follows the at least one carrier substrate changing step in which, while the relative positioning of the second carrier substrate relative to the receiving substrate is maintained, the adhesion sites of electronic components of a second transfer unit consisting of at least two of the electronic components arranged on the second carrier substrate are selectively irradiated with laser radiation in such a way that the adhesion of the electronic components of the second transfer unit is thereby selectively released from the second carrier substrate at the adhesion sites and the electronic components of the second transfer unit are each transferred to a grid position on the receiving substrate which corresponds to the electronic components' initial arrangement in the grid on the second carrier substrate.

3. The method according to claim 2, wherein the electronic components of the first transfer unit and of the second transfer unit each represent electronic light sources, and in each of the transfer steps light sources of one type which are different from light sources of at least one of the other transfer steps are transferred from a respective carrier substrate to the receiving substrate for the purpose of arranging a plurality of groups of light sources on the receiving substrate by means of a plurality of the transfer steps, wherein each of the groups contains light sources of at least two of the types, whose grid positions on the receiving substrate are arranged immediately adjacent to one another.

4. The method according to claim 3, wherein at least one of the groups is formed in such a way that a quantity consisting of respective numbers of light sources in the respective group which comprise the same type contains at least two different and non-zero numbers.

5. The method according to claim 2, wherein the electronic components which have been transferred to the intermediate carrier substrate by means of the first transfer step are spatially aligned according to a predetermined target grid in the alignment step; and in a subsequent transfer step, the electronic components which have been arranged in the predetermined target grid are transferred from the intermediate carrier substrate to a target substrate while the electronic components' arrangement in accordance with the target grid is maintained.

6. The method according to claim 1, wherein the electronic components which have been transferred to the intermediate carrier substrate by means of the first transfer step are spatially aligned according to a predetermined target grid in the alignment step; and in a subsequent transfer step, the electronic components which have been arranged in the predetermined target grid are transferred from the intermediate carrier substrate to a target substrate while the electronic components' arrangement in accordance with the target grid is maintained.

7. The method according to claim 6, wherein the subsequent a transfer step is performed by means of a multi-transfer tool which simultaneously transfers a plurality of electronic components from the intermediate carrier substrate to the target substrate in order to arrange the transferred components there in accordance with the predetermined target grid.

8. The method according to claim 6, wherein:
in addition to the first transfer step, at least one further transfer step takes place and, in at least two of the transfer steps comprising the first transfer step and the at least one further transfer step, different intermediate carrier substrates are used as receiving substrates, wherein each of the different intermediate carrier substrates includes an alignment device corresponding to a target grid, wherein the target grid is the same for each of the different intermediate carrier substrates;
the alignment step is performed with respect to each of the intermediate carrier substrates; and
in the subsequent transfer step, the aligned components are transferred from the different intermediate carrier substrates to the same target substrate and are arranged on the target substrate according to the target grid and a predetermined positioning relative to one another.

9. The method according to claim 1, wherein the alignment device is provided by means of positioning edges or cavities which are present on the intermediate carrier substrate.

10. The method according to claim 1, wherein:
at least two transfer steps are carried out, a carrier substrate used in each of these transfer steps, the carrier substrate being the same in each of these transfer steps, and an irradiation pattern used in each of these transfer steps, the irradiation pattern being the same in each of these transfer steps, the irradiation pattern is used with respect to the relative arrangement of the adhesion sites selectively irradiated by means of the laser radiation; and
if either of these transfer steps is followed by a further transfer step with the carrier substrate, then the relative position of the carrier substrate with respect to the receiving substrate is shifted in such a way that in a next further transfer step, using the same irradiation pattern, another of the electronic components of the carrier substrate is detached at each of the adhesion sites thus irradiated and transferred to the receiving substrate.

11. The method according to claim 10, wherein, during the course of the shifting of the relative position of the carrier substrate with respect to the receiving substrate, after each transfer step that is followed by the further transfer step:
a relative position of the irradiation pattern with respect to the carrier substrate is shifted by at least one grid position along at least one grid dimension so that thereafter the irradiation pattern is again directed to adhesion sites of electronic components on the carrier substrate that have not yet been detached; and
the relative position of the first carrier substrate with respect to the receiving substrate is shifted in such a way that a transfer unit transferred in a next further transfer step in accordance with the irradiation pattern is transferred to grid positions on the receiving substrate which are not yet occupied by electronic components due to at least one of the first transfer steps or the further transfer step.

12. The method according to claim 11, wherein the shifting of the relative position of the carrier substrate with respect to the receiving substrate is carried out by one grid position or by a number of grid positions which corresponds to dimensions of the transfer unit as a whole.

13. The method according to claim 1, wherein:
at least two transfer steps are carried out using a carrier substrate, the carrier substrate being the same in each of these transfer steps, wherein the carrier substrate is subdivided into a plurality of different, respectively limited partial areas;
in each of the at least two transfer steps, a transfer unit is transferred, wherein each transfer unit has electronic components which originate from a corresponding one of the partial areas of the plurality of partial areas;
two partial areas in the plurality of partial areas, each of which is assigned to a different transfer step of two immediately successive transfer steps, are not arranged adjacent to one another on the first carrier substrate; and
between the two immediately successive transfer steps, the relative position of the carrier substrate with respect to the receiving substrate is shifted in such a way that each transfer unit of these two transfer steps are arranged so as to be interleaved with one another or arranged adjacent to one another on the receiving substrate.

14. The method according to claim 1, wherein:
at least two transfer steps are carried out using a first carrier substrate, wherein each of these transfer steps uses the same first carrier substrate, wherein the first carrier substrate is subdivided into a plurality of different, respectively limited partial areas;
in each of these transfer steps, a transfer unit is transferred, wherein each transfer unit exclusively has electronic components which originate from a corresponding one of the limited partial areas; and
the relative position of the carrier substrate with respect to the receiving substrate is shifted between two immediately successive transfer steps in such a way that each transfer unit of these two transfer steps are arranged so as to be interleaved with one another on the receiving substrate.

15. The method according to claim 1, wherein:
a distance between the electronic components transferred to the receiving substrate is adjusted with respect to an original corresponding distance between the electronic components on a respective carrier substrate for a respective transfer step by means of an adjustment of a speed of movement of the belt.

16. A device for transferring electronic components from a carrier substrate to a receiving substrate, wherein the device is arranged to carry out the method according to claim 1.

* * * * *

UNITED STATES PATENT AND TRADEMARK OFFICE
CERTIFICATE OF CORRECTION

PATENT NO. : 10,854,775 B2
APPLICATION NO. : 16/347435
DATED : December 1, 2020
INVENTOR(S) : Klaus Schlemper, Hans-Peter Monser and Sigmund Niklas It is certified that error appears in the above-identified patent and that said Letters Patent is hereby corrected as shown below:

In the Claims

Claim 7, Column 18, Lines 61-62, the text "the subsequent a transfer step" should read --the subsequent transfer step--.

Claim 11, Column 20, Line 2, the text "the first transfer steps" should read --the first transfer step--.

Signed and Sealed this
Twenty-fifth Day of October, 2022

Katherine Kelly Vidal
*Director of the United States Patent and Trademark Office*